United States Patent [19]

Motté

[11] Patent Number: 5,039,955
[45] Date of Patent: Aug. 13, 1991

[54] CIRCUIT FOR GENERATING A STABLE CONTROL SIGNAL

[75] Inventor: Bruno P. J-M. Motté, Nijmegen, Netherlands

[73] Assignee: U.S. Philips Corporation, New York, N.Y.

[21] Appl. No.: 545,316

[22] Filed: Jun. 27, 1990

[30] Foreign Application Priority Data

Jul. 4, 1989 [NL] Netherlands ............ 8901698

[51] Int. Cl.$^5$ ............................................ H03L 7/099
[52] U.S. Cl. .................................... 331/10; 331/20; 331/36 C
[58] Field of Search ................ 231/10, 18, 20, 25, 231/34, 36 C, 111, 143

[56] References Cited

U.S. PATENT DOCUMENTS 3,364,431 1/1968 Doble et al. ............... 331/36 R X
4,634,939 1/1987 Dietz ........................ 315/399

FOREIGN PATENT DOCUMENTS 2487607 1/1982 France .
0004331 1/1984 Japan .
1116263 6/1968 United Kingdom .

Primary Examiner—David Mis
Attorney, Agent, or Firm—Bernard Franzblau

[57] ABSTRACT

A circuit for generating a control signal includes a frequency-determining element (C3), a clock generator for generating a clock signal and a control circuit coupled to the clock generator for generating a control signal as a function of the magnitude of the voltage at the frequency-determining element and for applying the control signal to the frequency-determining element. The control circuit includes a sawtooth generator having a sawtooth frequency-determining element (C1) for converting the clock signal into a second signal having a constant slope as a function of time, and a storage element (C2) which produces a voltage that depends on the amplitude of the sawtooth signal.

18 Claims, 1 Drawing Sheet 5,039,955

CIRCUIT FOR GENERATING A STABLE CONTROL SIGNAL

BACKGROUND OF THE INVENTION

This invention relates to a circuit comprising a frequency-determining element, a clock generator for generating a clock signal and a control circuit coupled to the clock generator for generating a control signal as a function of the magnitude of the voltage on the frequency-determining element and for applying the control signal to the frequency-determining element.

Such a circuit is disclosed in the French Patent Application FR-A 2487607. In this prior art circuit an oscillator is biased by the control signal. A second control signal, which is generated by a phase control loop and causes the oscillator signal to be substantially in synchronism with an incoming synchronizing signal, is superposed on this control signal. Since the substantially constant clock signal is used for biasing the circuit, the clock signal is fairly uniform, independent of variations of the supply voltage, and can be dimensioned such that the frequency of the oscillator is approximately in the middle of the lock-in range of the control loop. To that end the control circuit includes an auxiliary oscillator having a rather high frequency and which is incorporated in a control loop, the auxiliary oscillator being controlled to a substantially constant frequency with the aid of a control signal produced in the said control loop as the result of a phase comparison between the clock signal and a signal derived from the signal of the auxiliary oscillator by frequency division. A proportional portion of the latter control signal is the output signal of the control circuit. From the foregoing it will be obvious that the prior art circuit must be rather complicated.

SUMMARY OF THE INVENTION

An object of the invention has for its object to provide an oscillator circuit of the above-defined type which is of a simpler structure than the prior art circuit. To that end, a circuit according to the invention is characterized in that the control circuit includes a second frequency-determining element for converting the clock signal into a second signal having a constant slope as a function of time and a storage element for the said control signal which depends on the amplitude of the said second signal.

The generator according to the invention can be easily realized and comprises components which are not very critical. In a simple manner the generator can be dimensioned such that variations in response to spread and aging of the components and temperature variations between the components of the control circuit and of the oscillator are compensated.

BRIEF DESCRIPTION OF THE DRAWING

The invention will now be described in greater detail by way of example, with reference to the accompanying drawing, in which.

DESCRIPTION OF THE PREFERRED EMBODIMENTS

Figure 1:
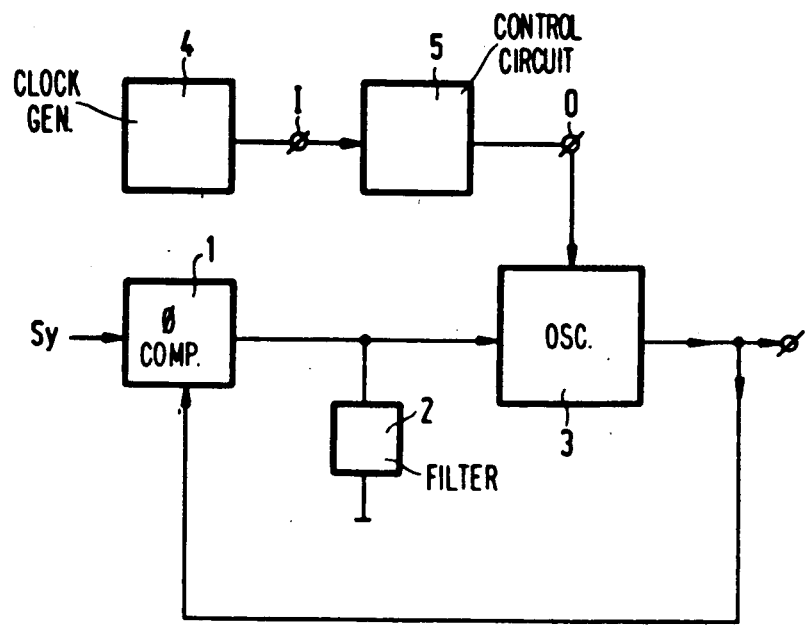
FIG. 1 is a simplified basic circuit diagram of a circuit according to the invention.

FIG. 1 shows a basic circuit diagram of a circuit according to the invention. At a first input a phase comparator stage 1 receives an incoming synchronizing signal Sy and at a second input a signal originating from an oscillator 3. Stages, not shown, for example a frequency divider can be present between the output of the oscillator 3 and the second input of the phase comparator stage when the oscillator frequency exceeds the frequency of the synchronizing signal. The phase comparator stage 1 supplies from an output a signal which depends on the phase difference between the input signal of stage 1 and which, after having been smoothed by a loop filter 2, is applied as the first control signal to the oscillator 3 for controlling the frequency and/or the phase of the oscillator signal. In the stable state of the phase control loop formed by elements 1, 2 and 3 the input signals of stage 1 have the same frequency at substantially the same phase.

A clock generator 4 generates a clock signal of a constant clock frequency and applies this clock signal to a control circuit 5. The control circuit 5 supplies a signal which is applied as the second control signal to the oscillator 3. The phase control loop generates the first control signal for the oscillator in the case where the synchronizing signal is present. If the second control signal is now chosen appropriately, the oscillator frequency will be approximately halfway the lock-in range, which is the nominal state.

Figure 2:
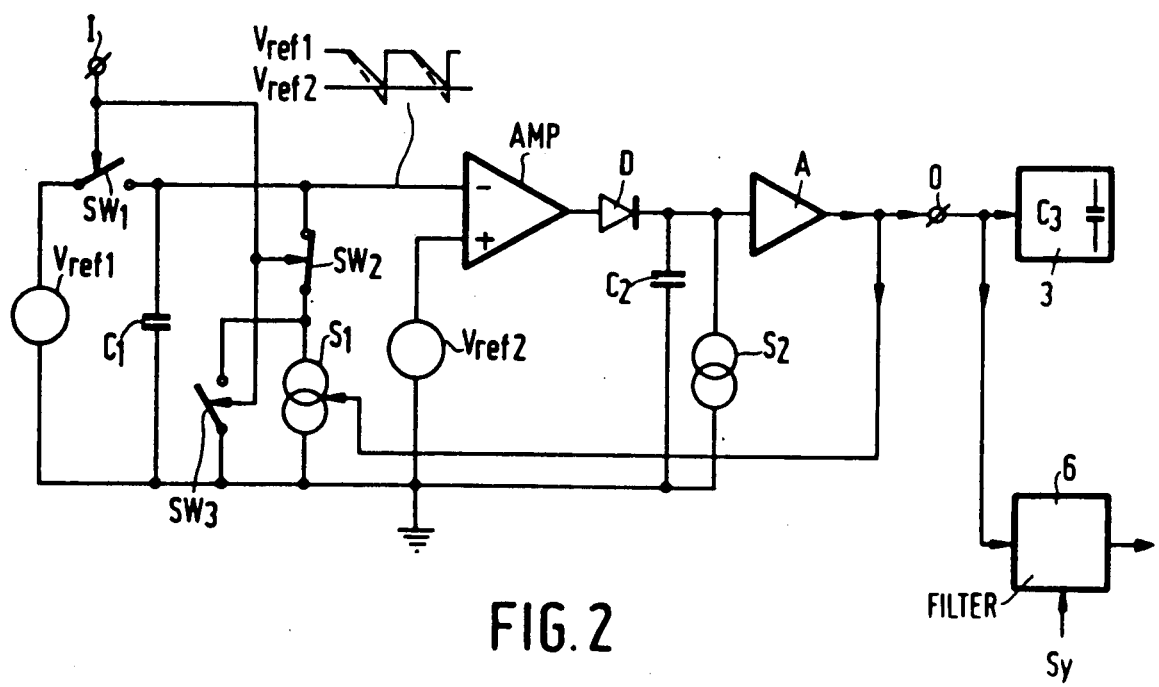
FIG. 2 is a circuit diagram of a preferred embodiment of a control circuit which forms a part of the circuit in accordance with the invention.

FIG. 2 shows a more elaborate circuit diagram of the control circuit 5 of FIG. 1. At an input I the control circuit receives the clock signal from the clock generator 4 of FIG. 1. At an output O the control circuit generates an output signal which is applied as the second control signal to the oscillator 3 of FIG. 1. The present synchronizing circuit forms, for example, part of a picture display device, the oscillator 3 then being a line oscillator for the horizontal deflection having a nominal frequency of 15.75 kHz (U.S. televison standard). The oscillator 3 may operate at the line frequency or a multiple thereof. Optionally, the local signal applied to the second input of stage 1 is supplied by a line deflection circuit, which circuit is supplied with a line signal originating from the oscillator. The clock signal is derived from a chrominance subcarrier signal having a nominal frequency of approximately 3.58 MHz. The clock generator 4 is, for example, a frequency divider receives a signal originating from an auxiliary carrier oscillator and which divides the frequency of this signal by 14, from which a clock signal can be obtained with a frequency of approximately 255 kHz.

The clock signal is a square-wave signal and drives controllable switches SW1, SW2 and SW3. The switch SW1 has one side connected to a first reference voltage source Vref1 and its other side to an inverting input of a differential amplifier AMP. In addition, a capacitor C1 is connected to the amplifier inverting input. A controllable current source S1 is connected to the amplifier inverting input via a switch SW2. The capacitor and the current source S1 have their other side connected to ground. The junction point between the switch SW2 and the current source S1 is connected to ground via the switch SW3. The non-inverting input of the differential amplifier AMP is connected to a second reference voltage source Vref2. The output of the amplifier AMP is connected to an input of an amplifier A via a rectifier D. A storage element constituted by a capacitor C2, which has its other end connected to ground, is also connected to said input. The output of the amplifier A is fed back to a control input of the current source S1. The output of the amplifier A also constitutes the output O of the control circuit 5.

When the square-wave clock signal becomes high, the switches SW1 and SW3 become conductive and the switch SW2 is rendered non-conducting, and when the clock signal becomes low, the switches SW1 and SW3 are rendered non-conducting and the switch SW2 becomes conductive.

If the switch SW1 conducts, the first reference voltage Vref1 is present across the capacitor C1. The first reference voltage Vref1 exceeds the second reference voltage Vref2, as a result of which the amplifier AMP supplies a negative output voltage. Because of this negative voltage the rectifier D will not conduct. If the switches SW1 and SW3 become non-conducting, the voltage across the capacitor C1 decreases linearly because the switch SW2 is conducting and the current source S1 withdraws a constant current from the capacitor C1. When the voltage across C1 decreases to below the voltage Vref2, the amplifier AMP supplies a positive voltage and the rectifier D will conduct. A current which recharges the capacitor flows through the capacitor C2, in response to which the voltage across the capacitor and consequently the output voltage of the amplifier A increases. The current source S1 is controlled such that the current thereof obtains a lower value so that the sawtooth-shaped signal across the capacitor C1 reaches the value Vref2 at a later instant than would be the case if the current source S1 were not controlled. As a result thereof the current pulse through the rectifier D is of a shorter duration. This proves that in the stable state of the control loop formed by the elements C1, S1, AMP, D, C2 and A the edge of the sawtooth voltage produced during the time in which the switch SW1 is inhibited reaches the value Vref2 at the instant at which the switch becomes conductive again. At that instant the rectifier D is briefly conducting to compensate for discharging currents, illustrated in FIG. 2 by a current source S2. The sawtooth voltage across the capacitor C1, which has a constant frequency if the frequency of the clock signal of the generator 4 is constant, consequently has a substantially uniform slope as a function of time (see FIG. 2), so that the value of the d.c. voltage at the output O only depends on the values of the elements of the circuit shown in FIG. 2. If these values are constant, then also said voltage is constant. The elements of the circuit can be chosen such that the said voltage is of such a value that the oscillator 3 supplies a signal having the nominal frequency.

It should be noted that the circuit of FIG. 2 can be structured differently to obtain the same result. The control for keeping the voltage across the capacitor C2 constant can alternatively be effected in response to an error signal which depends on the difference between this voltage and a third reference voltage. It should be further noted that in the foregoing description tolerances of the circuit elements and changes caused by temperature fluctuations, aging and such have not been taken into account. This can be explained in the following manner.

For the capacitor C1, which is discharged with the aid of a current source, it holds that the product of the current i1 of the source and the discharging time $\Delta t$ is equal to the product of the capacitance C1 and the voltage difference $\Delta W1 = Vref1 - Vref2$ across the capacitor:

$$i1 * \Delta t = C1 * \Delta W1 \tag{1}$$

The time $\Delta t$ is a given portion of the clock signal period, for example, half the period, so the clock frequency $f = 1/(2*\Delta t)$. The equation (1) can be rewritten to:

$$i1 = C1 * \Delta W1 * 2f \tag{2}$$

The oscillator 3 is of such a structure that the signal generated thereby has a uniform variation as a function of time which is of the same form as the signal at the inverting input of the amplifier AMP. The oscillator 3 consequently is a sawtooth generator having a different frequency than the generator consisting of C1 and S1 and includes a capacitor C3 which is charged and discharged, respectively, between two reference voltage levels Vref1' and Vref2'. For the respective charging and discharging current i2 of the capacitor C3 a value is chosen which is equal to k*i1, wherein, for example, k=1. For the capacitor C3 a similar equation as for the capacitor C1 holds:

$$i2 * \Delta tosc = C3 * \Delta Wosc \tag{3}$$

wherein $$\Delta Wosc = Vref1' - Vref2'$$

and wherein $\Delta tosc$ is the charging or discharging time of the capacitor C3. The equation (3) can be rewritten to $$\Delta tosc = C3 * \Delta Wosc / i2 \tag{4}$$

in this example i2=i1; when the value for i1 is substituted in equation (4) it results in:

$$\Delta tosc = (C3 * \Delta Wosc)/(C1 * \Delta W1 * 2f) = (C3/C1)*(\Delta Wosc/\Delta W1)*(1/(2f)) \tag{5}$$

The ratio C3/C1 is constant. If, in addition, the capacitors C1 and C3 are integrated in the same integrated circuit, then this ratio has a much narrower tolerance than the capacitances C1 and C3 themselves. The reference voltages Vref1 and Vref2 and the reference voltages Vref1' and Vref2' are chosen such that the ratios of $\Delta Wosc/\Delta W1$, i.e. $(Vref1 - Vref2)/(Vref1' - Vref2')$, is constant and independent of variations of the separate reference voltages. Since the frequency f of the clock generator is also constant, it follows that the time $\Delta tosc$ and consequently the nominal frequency of the oscillator 3 is fully determined and is substantially independent of spreads in the components, temperature fluctuations or aging. It should be noted that the capacitance of the capacitor C2 is of no importance in the foregoing. The capacitor C2 must be chosen to have an adequately high value to smooth the signal applied, but it must at the same time be small enough so that it does not respond too slowly to permanent changes.

The control signal at the output O can alternatively be used in other portions of the picture display device, for example, for a circuit for indicating the presence of a line or field synchronizing signal. Such a filter circuit is then used for signal identification purposes and in FIG. 2 is denoted by reference numeral 6. If, for example, the line synchronizing signal Sy is applied to the circuit 6 in FIG. 2, then a signal having the line frequency is supplied. Spreads in this signal are compensated by the signal at the output O in a similar manner to the spreads in the signal originating from the oscillator 3.

I claim:

1. A control circuit comprising: means for deriving a signal determined by a first frequency-determining element, a clock generator for generating a clock signal, a control circuit coupled to the clock generator for generating a control signal as a function of the first frequency-determining element and for applying the control signal to the signal deriving means, wherein the control circuit includes a sawtooth generator comprising a second frequency-determining element for converting the clock signal into a sawtooth signal having a constant slope as a function of time and a storage element coupled to the sawtooth generator for producing and storing said control signal, and means for supplying said control signal to a control input of the sawtooth generator thereby to control the slope of the sawtooth signal to a constant value.

2. A control circuit as claimed in claim 1, wherein the sawtooth generator includes a controllable element coupled to the storage element for determining the variation of the sawtooth signal generated by the sawtooth generator as a function of the control signal of the storage element.

3. A control circuit as claimed in claim 2, wherein the sawtooth signal generated by the sawtooth generator and the signal produced by the signal deriving means are identical as a function of time.

4. A control circuit as claimed in claim 3, wherein the signal generated by the signal deriving means is a sawtooth signal.

5. A control circuit as claimed in claim 3 wherein the second frequency-determining element includes a capacitor, a first reference voltage source for charging the capacitor during a portion of a period of the clock signal, and wherein the controllable element comprises a current source for discharging the capacitor during a remaining portion of said period.

6. A control circuit as claimed in claim 5, further comprising a differential amplifier having a first input coupled to the capacitor, a second input coupled to a second reference voltage source, and an output connected to the storage element via a unidirectional current conducting element, and wherein the storage element comprises a second capacitor.

7. A control circuit as claimed in claim 6, wherein the first frequency-determining element comprises a third capacitor and said signal deriving means includes two further reference voltage sources for charging and discharging, respectively, the third capacitor, the ratio of the difference between the voltages of the first and second reference voltage sources and the difference between the voltages of the two further reference voltage sources being substantially constant.

8. A control circuit as claimed in claim 6, wherein the charging and discharging current, respectively, of the capacitor of the sawtooth generator and of the third capacitor have a substantially constant ratio.

9. A control circuit as claimed in claim 1, wherein the clock generator comprises a frequency divider coupled to an input terminal for a clock signal.

10. A control circuit as claimed in claim 1, wherein said storage element is part of an integrator coupled to the sawtooth generator for integrating the sawtooth signal to derive said control signal.

11. A control circuit as claimed in claim 1, wherein said signal deriving means comprises an oscillator including said first frequency-determining element.

12. A control circuit comprising:
an input for receiving a first periodic signal,
a generator, which includes a first reactance element, coupled to said input and responsive to said first periodic signal for converting said first periodic signal into a second periodic signal which exhibits a uniform variation as a function of time,
means including a storage element coupled to an output of said signal generator for deriving a control signal which is determined by said second periodic signal,
means for coupling said control signal to a control input of the signal generator thereby to control the variation of the second periodic signal, and
an output coupled to said storage element for supplying said control signal to a load.

13. A control circuit as claimed in claim 12, wherein said signal generator further comprises a controllable constant current source coupled to said control input of the signal generator and to said first reactance element.

14. A control circuit as claimed in claim 13, wherein said reactance element comprises a capacitor, said signal generator further comprising switching means controlled by the first periodic signal for selectively coupling the capacitor to a source of reference voltage and to said controllable current source.

15. A control circuit as claimed in claim 13, wherein said control signal deriving means comprises an integrator circuit which includes said storage element.

16. A control circuit as claimed in claim 12, further comprising an oscillator circuit having an input coupled to the output of the control circuit, said oscillator circuit being operative to generate at its output a third periodic signal similar to the second periodic signal and at a frequency that is an integer multiple thereof.

17. A control circuit as claimed in claim 16, further comprising a phase comparator having a first input coupled to the output of the oscillator circuit and a second input for receiving a periodic synchronizing signal, and
means coupling an output of the phase comparator to a second input of the oscillator circuit whereby the oscillator circuit and the phase comparator together comprise a phase control loop.

18. A control circuit as claimed in claim 16, wherein said periodic signal generator and said oscillator circuit each comprise a sawtooth generator whereby said second and third periodic signals are sawtooth signals.

* * * * *